United States Patent
Arayama et al.

(10) Patent No.: US 8,689,167 B2
(45) Date of Patent: Apr. 1, 2014

(54) LAYOUT DESIGN APPARATUS AND LAYOUT DESIGN METHOD

(75) Inventors: Masashi Arayama, Gamagori (JP); Yuuki Watanabe, Toyohashi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/534,141

(22) Filed: Jun. 27, 2012

(65) Prior Publication Data
US 2013/0036396 A1 Feb. 7, 2013

(30) Foreign Application Priority Data
Aug. 4, 2011 (JP) .................. 2011-171382

(51) Int. Cl.
G06F 17/50 (2006.01)
(52) U.S. Cl.
USPC .............................. 716/126; 716/55; 716/139
(58) Field of Classification Search
USPC .......................... 716/55, 126, 139
See application file for complete search history.

(56) References Cited

U.S. PATENT DOCUMENTS

| | | | |
|---|---|---|---|
| 4,910,680 A * | 3/1990 | Hiwatashi | ............ 716/126 |
| 6,457,158 B1 | 9/2002 | Inoue | |
| 2010/0235797 A1 | 9/2010 | Arayama et al. | |

FOREIGN PATENT DOCUMENTS

| | | |
|---|---|---|
| JP | 6-139311 | 5/1994 |
| JP | 2000-353746 | 12/2000 |
| JP | 2006-268365 | 10/2006 |
| WO | 2009/084092 | 7/2009 |

* cited by examiner

*Primary Examiner* — Thuan Do
(74) *Attorney, Agent, or Firm* — Staas & Halsey LLP

(57) ABSTRACT

A layout design apparatus includes: a memory unit to store design data of a hierarchical layout of a multilayer circuit including a macro; a channel count calculation unit to calculate a channel count of channels available to lead wiring from a terminal of the macro to a wiring layer based on the design data stored in the memory unit; and a path calculation unit to calculate a path for leading wiring from a terminal of the macro to the wiring layer in ascending order of the channel count.

6 Claims, 10 Drawing Sheets

LAYOUT DESIGN APPARATUS AND LAYOUT DESIGN METHOD

CROSS-REFERENCE TO RELATED APPLICATION(S)

This application is based upon and claims the benefit of priority of the prior Japanese Patent Application No. 2011-171382, filed on Aug. 4, 2011, the entire contents of which are incorporated herein by reference.

FIELD

The embodiments discussed herein are related to a layout design apparatus and a layout design method.

BACKGROUND

For example, an integrated circuit such as a large scale integration (LSI) may be designed by using individual macros that are circuit blocks each having different function made by dividing processing. Designed macros are placed in the integrated circuit, and the inter-macro wiring is designed. Subsequently, the overall performance of the integrated circuit is assessed.

Inside the integrated circuit, circuits are formed with multilayer wiring across a plurality of layers. Via holes are formed in the layers of the integrated circuit, and the macros are coupled to connecting wiring by leading terminals formed in the macros to one of the layers in which the connecting wiring is formed.

Related art is disclosed in Japanese Laid-open Patent Publication No. 6-139311, Japanese Laid-open Patent Publication No. 2006-268365, Japanese Laid-open Patent Publication No. 2000-353746, and International Publication Pamphlet No. WO 2009/084092.

SUMMARY

According to one aspect of the embodiments, a layout design apparatus includes: a memory unit to store design data of a hierarchical layout of a multilayer circuit including a macro; a channel count calculation unit to calculate a channel count of channels available to lead wiring from a terminal of the macro to a wiring layer based on the design data stored in the memory unit; and a path calculation unit to calculate a path for leading wiring from a terminal of the macro to the wiring layer in ascending order of the channel count.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

For example, when circuits are placed in a printed circuit board, wiring such as leading paths between circuits, placing via holes, etc. may be designed. It may be determined whether or not there is any free channel available in proximity for routing a channel that covers a macro terminal to a designated wiring layer. An imaginary grid is placed on a board with a certain interval, and a position may be specified according to the imaginary grid. The channel corresponds to the grid that allows to form a signal path to a different layer through a via hole, etc.

When designing wiring between macros in a stage where the macros are placed in an LSI, there may be a terminal from which no wiring is led. When changing positions of the macros does not give a solution, etc., a macro redesigning may be performed.

When determining whether or not there is any free channel available, effects from other terminal's leading wiring may not be considered. Accordingly, a terminal may not lead due to the effects from other terminal's leading wiring.

Figure 1:
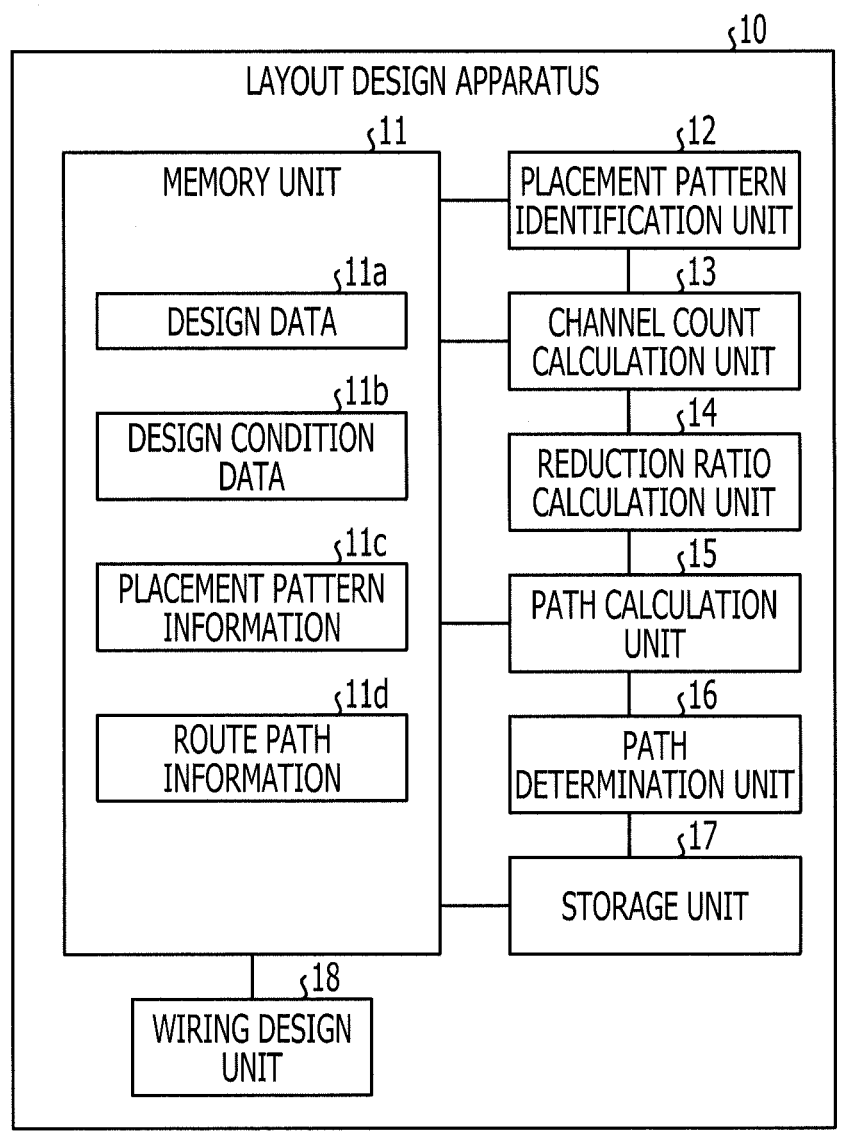
FIG. 1 illustrates an exemplary layout design apparatus.

FIG. 1 illustrates an exemplary layout design apparatus. As illustrated in FIG. 1, the layout design apparatus 10 includes a memory unit 11, a placement pattern identification unit 12, a channel count calculation unit 13, a reduction ratio calculation unit 14, a path calculation unit 15, a path determination unit 16, a storage unit 17, and a wiring design unit 18. The layout design apparatus 10 carries out designing of an integrated circuit such as an LSI, etc., and may be a computer or the like, for example. In designing the integrated circuit such as an LSI, etc., layout designing of individual macros may be carried out in accordance with design rules. The designed macros are placed in the integrated circuit, and designing of inter-macro wiring is carried out. Subsequently, the overall performance of the integrated circuit is assessed. The designing of macro is carried out by utilizing park of plural wiring layers of the integrated circuit. In the inter-macro wiring designing, via holes are formed in layers of the integrated circuit, and macro terminals are led with wiring to a predetermined wiring layer so as to make connection with connecting wiring. For example, when the integrated circuit has a plurality of wiring layers 1-8, the macros are designed by using the wiring layers 1-5. The inter-macro wiring is designed by using the wiring layers 6-8. When the designing of the macros is finished, the layout design apparatus 10 determines whether or not it is available for leading a wiring from all the macro terminals.

The memory unit 11 stores a variety of information. For example, the memory unit 11 may store design data 11*a*, design condition data 11*b*, placement pattern information 11*c*, or leading path information 11*d*. The memory unit 11 may be, for example, a data-rewritable semiconductor memory such as a flash memory and a NVSRAM, and a storage apparatus such as a hard disk and an optical.

The design data 11*a* includes circuit layout information or position information of terminals that input and output a signal, for each layer of the designed macro. The design condition data 11*b* includes design conditions on circuit designing. The circuit conditions may include, for example, information regarding a wiring width, a via size, a minimum wiring spacing or the like in each layer. The placement pattern information 11c includes channel information regarding a channel available for wiring at each macro terminal in each placement pattern identified by the placement pattern identification unit 12. The leading path information 11d includes leading path information of wiring for each macro terminal in each placement pattern.

In the circuit designing, a position of a circuit may be arbitrarily specified. For ease of specifying the position, an imaginary grid may be placed with a certain interval on a board, and the position may be specified according to the imaginary grid. The interval of a placement grid used for placing the macros and the interval of a wiring grid used for placing wiring may be different The design condition data 11b may include the interval of the placement grid used for placing the macros and the interval of the wiring grid used for placing wiring, as the design conditions.

Figure 2:
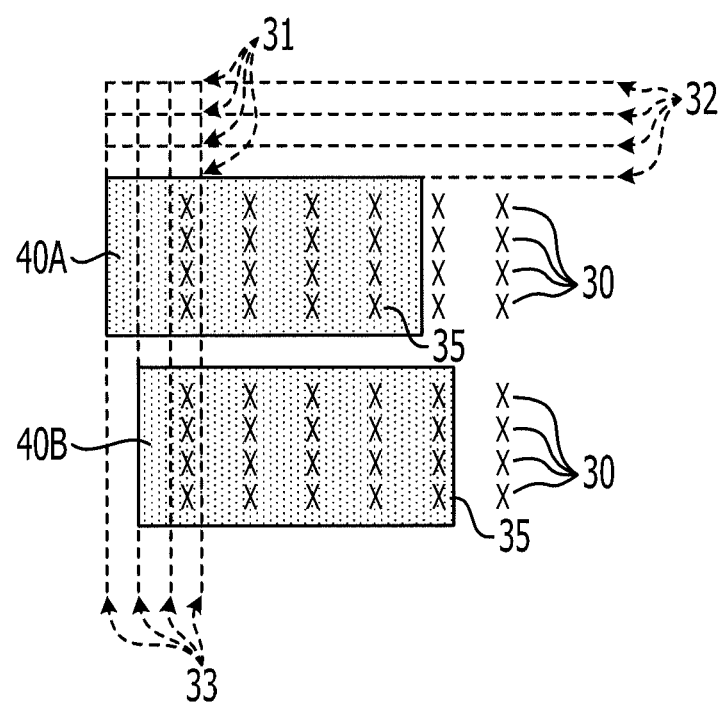
FIG. 2 illustrates an exemplary relationship between a macro placement grid and a wiring grid.

FIG. 2 illustrates an exemplary relationship between the placement grid for the macros and the wiring grid. In FIG. 2, parts of the placement grid and the wiring grid may be illustrated. The symbol "x" indicated in FIG. 2 indicates an intersection point of a wiring grid 30. Dash lines 32, which are parallel to the lateral direction as illustrated in FIG. 2, indicate longitudinal direction placement positions in a placement grid 31. Dash lines 33, which are parallel to the longitudinal direction as illustrated in FIG. 2, indicate direction placement positions in the placement grid 31. Intersection points of the dash lines 32 and the dash lines 33 indicate placement positions in the placement grid 31. For example, the wiring grid 30 may be formed with twice the interval of the placement grid 31 in the lateral direction. The macro may be placed by aligning to the placement grid 31. The wiring may be placed over the wiring grid 30 according to the wiring grid 30. For example, macros 40A and 40B, which are substantially the same size as each other, may be placed while one of the macros 40A and 40B is being shifted from the other by single placement grid interval distance in the lateral direction. Part of the wiring grid 30 positioned inside the macros 40A and 40B may be wiring channels 35 that indicate positions available for wiring. Since the intervals of the wiring grid 30 and the placement grid 31 are different from each other, the number of the wiring channels 35 in a macro may change depending on the macro placement position. For example, the macro 40A includes four columns of the wiring channels 35. The macro 40B placed at the position shifted by single placement grid interval distance includes five columns of the wiring channels 35. For each macro, there may be a plurality of placement patterns of the wiring channels 35 depending on the placement position. The number of patterns included in such placement patterns is obtained from the longitudinal and lateral intervals of the wiring grid 30 and the longitudinal and lateral intervals of the placement grid 31 by using the following equation (1).

The number of patterns=[(least common multiple of wiring grid's longitudinal interval and placement grid's longitudinal interval)/placement grid's longitudinal interval]×[(least common multiple of wiring grid's lateral interval and placement grid's lateral interval)/placement grid's lateral interval] (1)

For example, when the placement grid's longitudinal interval is 100, the wiring grid's longitudinal interval is 200, the placement grid's lateral interval is 100, and the wiring grid's lateral interval is 100, the number of patterns is obtained as (200/100)×(100/100)=2×1=2.

The placement pattern identification unit 12 identifies the placement pattern of the macro's wiring channels 35. For example, when the placement grid interval and the wiring grid interval are different, the placement pattern unit 12 obtains the placement pattern of the wiring channels 35 by sequentially shifting the macro placement position by single placement grid interval distance in a direction in which the intervals are different, within a range of single wiring grid interval distance. For example, when the placement grid interval and the wiring grid interval are different in one of the longitudinal direction and the lateral direction, the placement pattern of the wiring channels 35 may be obtained by sequentially shifting the macro placement position by single placement grid interval distance in that one direction, within a range of single wiring grid interval distance. For example, two placement patterns illustrated in FIG. 2 may be obtained. When the placement grid interval and the wiring grid interval are different in both the longitudinal direction and the lateral direction, the placement patterns of the wiring channels 35 may be obtained by sequentially shifting the macro placement position by single placement grid interval distance in one of the longitudinal direction and the lateral direction, within a range of single wiring grid interval distance. Once the shifting of the macro placement position is completed in the one direction, the macro placement position may be shifted in the other direction by single placement grid interval distance within a range of single wiring grid interval distance, and again sequentially shifted in the one direction by single placement grid interval distance, to obtain the placement patterns of the wiring channels 35.

The placement pattern identification unit 12 stores in the memory unit 11 relative placement positions of the wiring channels 35 within a macro, for each placement pattern, as the placement pattern information 11c. When the intervals of the placement grid 31 and the wiring grid 30 are substantially the same as each other, all individual placement positions of the wiring channels 35 may not be stored as the placement pattern information 11c. For example, the placement pattern information 11c may include the position of one of the wiring channels 35 within a macro as well as the longitudinal interval and the lateral interval of the wiring grid 30. When the position of one of the wiring channels 35 and the longitudinal interval and the lateral interval of the wiring grid 30 are stored as the placement pattern information 11c, positions of the wiring channels 35 may be each identified based on the stored position of the one of the wiring channels 35 and the stored longitudinal and lateral interval of the wiring grid 30.

For each of the placement patterns, the channel count calculation unit 13 calculates a channel count of the channels available to lead wiring from a macro terminal to a predetermined wiring layer, for each terminal. The channel count indicates the number of channels that allow to form a signal path to a different layer through a via hole, etc. The predetermined wiring layer corresponds to a wiring layer in which leading paths to outside the macro are formed, and may be the top layer or a middle wiring layer in which leading paths are formed. Alternatively, the predetermined wiring layer may be a plurality of layers including leading paths. The wiring layer, in which leading paths to outside the macro are formed, may also be referred to as a leading target layer.

Figure 3:
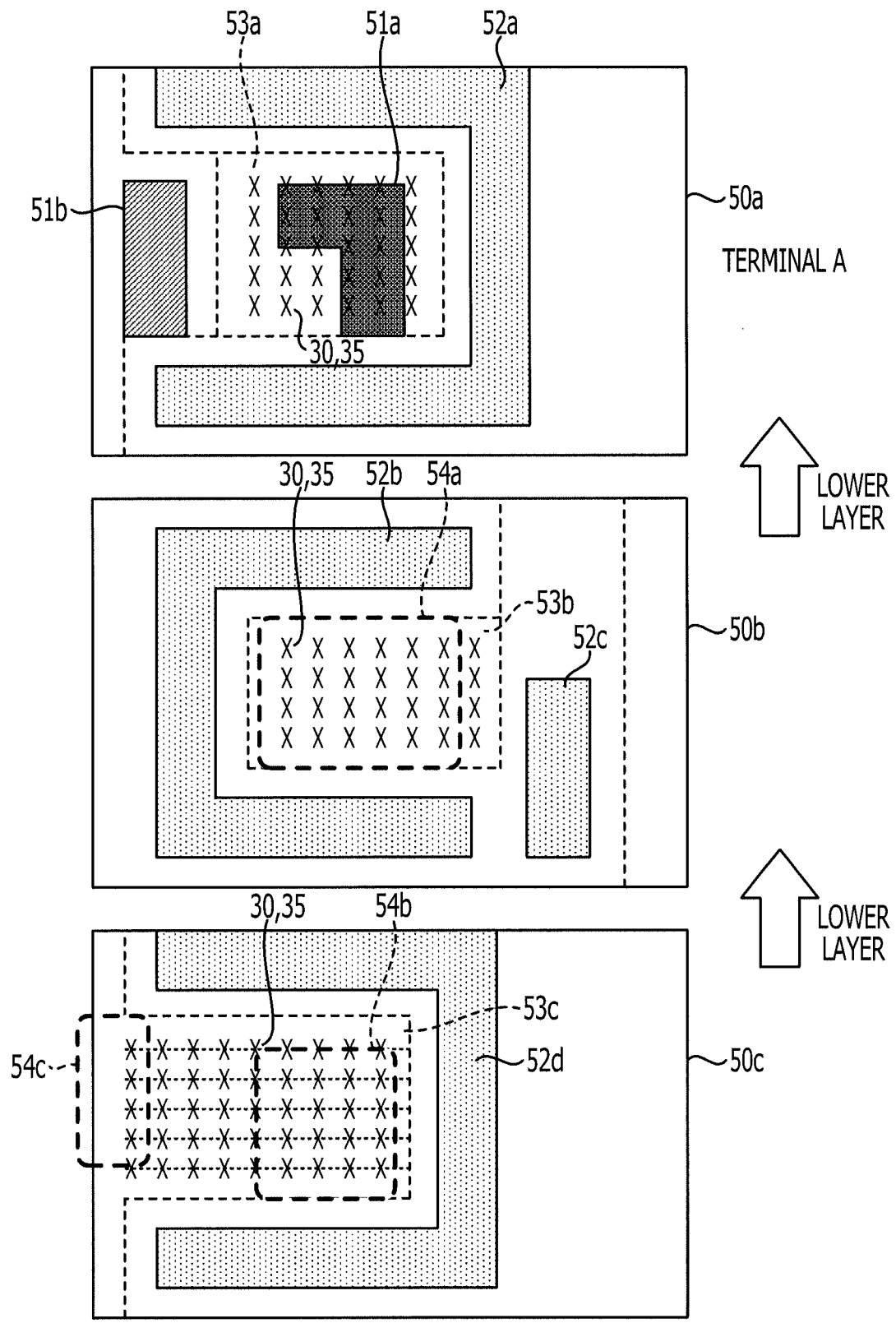
FIG. 3 illustrates an exemplary hierarchical layout.

FIG. 3 illustrates an exemplary hierarchical layout. The Layout illustrated in FIG. 3 may be hierarchical layout of from a macro terminal layer to a leading target layer A wiring layer 50b may be provided on a terminal layer 50a, and a routing target layer 50c, in which leading paths to outside the macro are formed, may be provided on the wiring layer 50b. A terminal 51a and a terminal 51b, which are placed next to each other, are provided on the terminal layer 50a as the macro terminals. A wiring metal 52a is provided on the terminal layer 50a so as to enclose the terminal 51a from three directions and opens at the other direction toward the terminal 51*b*. Wiring metals 52*b* and 52*c* are provided on the wiring layer 50*b*. A wiring metal 52*d* is provided on the leading target layer 50*c*.

For example, for each placement pattern, the channel count calculation unit 13 identifies the wiring channels 35 available to lead wiring from each terminal based on the design data 11*a* and the placement pattern information 11*c*, for each layer of from the terminal layer 50*a* to the leading target layer 50*c*. For example, for each macro terminal, the channel count calculation unit 13 obtains available regions where the leading wiring from the terminal may be placed in each layer. The available region may be, for example, a region that includes one of the terminals and is outside spacing regions of other terminals and wiring. For each macro terminal, the channel count calculation unit 13 identifies part of the wiring grid 30 in the available region as the available wiring channels 35, in each layer. For example, in the terminal layer 50*a*, part of the wiring grid 30 in a region 53*a* may be identified as the available wiring channels 35. In the wiring layer 50*b*, part of the wiring grid 30 in a region 53*b* may be identified as the available wiring channels 35. In the routing target layer 50*c*, part of the wiring grid 30 in a region 53*c* may be identified as the available wiring channels 35.

The channel count calculation unit 13 compares the available wiring channels 35 of all the layers, and calculates the channel count of the wiring channels 35 that fall in substantially the same positions in each layer of from the terminal layer 50*a* to the routing target layer 50*c*. For example, in FIG. 3, an overlapping region of for the region 53*a* of the terminal layer 50*a*, the region 53*b* of the wiring layer 50*b* and the region 53*c* of the routing target layer 50*c* is obtained. A region 54*a* of the wiring layer 50*b* may be an overlapping region of the region 53*a* of the terminal layer 50*a* and the region 53*b* of the wiring layer 50*b*. A region 54*b* of the leading target layer 50*c* may be an overlapping region of the region 54*a* of the wiring layer 50*b* and the region 53*c* of the routing target layer 50*c*. The region 54*b* of the leading target layer 50*c* may be an overlapping region of the region 53*a*, the region 53*b*, and the region 53*c*. The number of the wiring channels 35 within the region 54*b* may be the channel count of the wiring channels 35 in substantially the same positions, for the terminal 51*a*. A region 54*c* may be an overlapping region of available regions in the layers of from the terminal layer 50*a* to the routing target layer 50*c*, for the terminal 51*b*.

Figure 4:
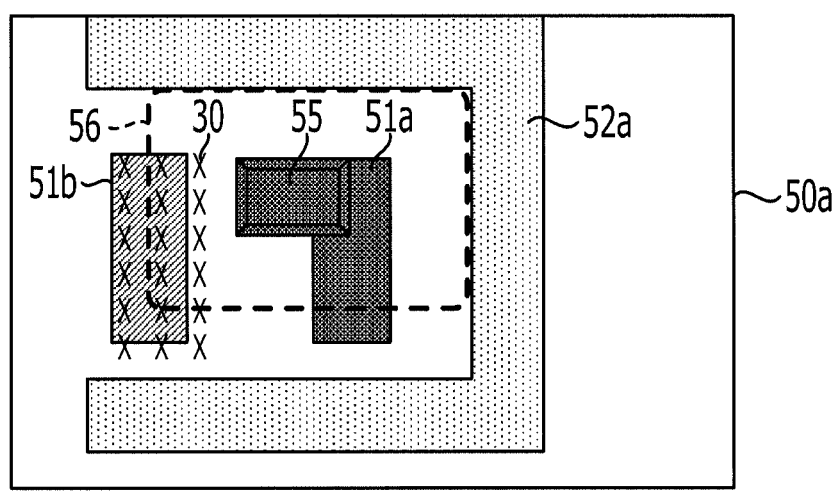
FIG. 4 illustrates an exemplary wiring channel constraint.

In each macro terminal, there may be some constraints on usage of the available wiring channels 35 due to effects from the leading wiring for surrounding terminals. FIG. 4 illustrates an exemplary wiring channel constraint. In FIG. 4, the available wiring channels may be limited. For example, A via 55 is provided on the terminal 51*a* of the terminal layer 50*a*. When the terminal 51*b* has no via 55, the leading wiring may be placed on the terminal 51*b* and nearby wiring channels 35. When the terminal 51*b* has the via 55, a spacing region 56 is provided to keep a distance from the via 55 as the design condition. Accordingly, the number of the available wiring channels 35 may be reduced. For example, the number of the available wiring channels 35 may be reduced from 18 to 8.

For each placement pattern, the reduction ratio calculation unit 14 calculates, for each macro terminal, a reduction ratio of the channel count of the available channels due to effects from the leading wiring of other terminals. For example, the reduction ratio calculation unit 14 may obtain the available region for each terminal in the terminal layer 50*a*. The reduction ratio calculation unit 14 may obtain, for each terminal, a non-affected region that is a region calculated by subtracting a region or regions affected by the other terminal's leading wiring from the available region. The reduction ratio calculation unit 14 may obtain, for each terminal, a reduced channel count by subtracting the number of the wiring channels 35 in the non-affected region from the number of the wiring channels 35 in the available region. The reduction ratio calculation unit 14 may calculate the reduction ratio by dividing the reduced channel count by the number of the wiring channels 35 in the available region.

When there is a terminal which reduction ratio is equal to or larger than a certain threshold value, the reduction ratio calculation unit 14 identifies the terminal which reduction ratio is equal to or larger than the certain threshold value, and a terminal that causes the reduction in the channel count of the available channels in the vicinity of the terminal which reduction ratio is equal to or larger than the certain threshold value. The predetermined threshold value may be, for example, 30° k. The certain threshold value may be adjusted externally. With regard to identified terminals, the reduction ratio calculation unit 14 may compare the numbers of the available wiring channels 35, and updates the number of the available wiring channels for each terminal to the lowest value. For example, in FIG. 4, since the via 55 is formed in the terminal 51*a*, the number of the channels available for the leading wiring on the terminal 51*b* is reduced by 55%, exceeding the exemplary predetermined threshold value for the reduction ratio. The lower number of the available channels for the terminal 51*a* and the terminal 51*b* may be used as the new number for both the terminals 51*a* and 51*b*. As a result, the numbers of available channels for a combination of terminals that largely affect to each other may become substantially the same. Accordingly, in path calculations carried out by the path calculation unit 15, positions in the order of the path calculation for the terminals that largely affect to each other may become close to each other. Accordingly, a backtracking process may be performed more effectively when the path is recalculated.

For each placement pattern, the path calculation unit 15 calculates a path for the leading wiring from each macro terminal to the leading target layer, by using the wiring width, the via size, or the minimum wiring spacing, which is included in the design conditions, in ascending order of the number of the available channels. For example, the path calculation unit 15 calculates the path by using the wiring width or the via size included in the design conditions. The path calculation unit 15 calculates a path while keeping a distance equal to or more than the minimum wiring spacing from the leading wiring of other terminals whose path is already calculated. The path may be calculated by using an existing path search method. The path search method may include, for example, a "line search method", a "maze method", etc. For each placement pattern, when the path for each terminal is calculated, the path calculation unit 15 stores the path calculated for each terminal as the leading path information 11*d*. When there is a terminal whose path is not calculated, the path calculation unit 15 carried out a backtracking process that goes back to the path calculation of the one previous terminal. For example, the path calculation unit 15 repeats a recalculation of the path by sequentially going back to the calculation of the previous terminal before the terminal whose path is not calculated in ascending order of the number of the wiring channels 35, until a new path different from any of calculated paths is calculated. The calculation of a new path may be, for example, carried out by storing calculated paths and setting the calculated paths in a region, which is excluded from the original path calculation, for example, the spacing region.

Figure 5:
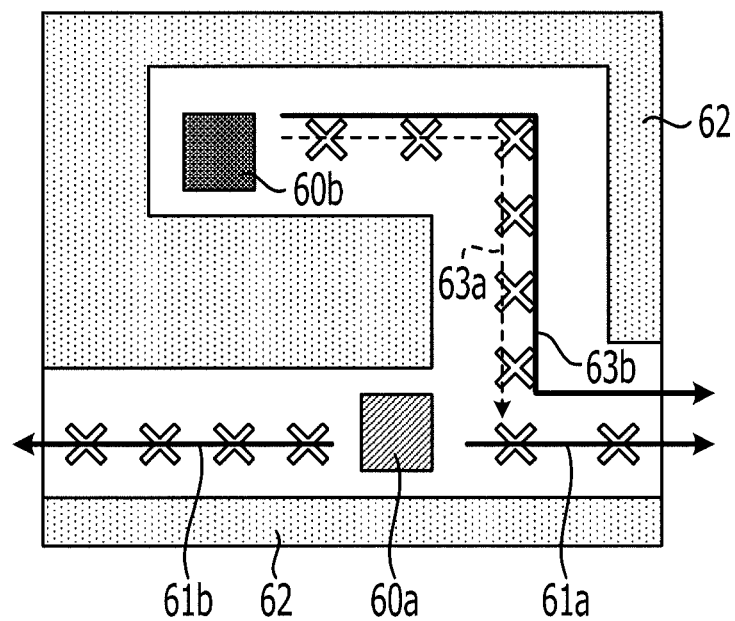
FIG. 5 illustrates an exemplary backtracking process.

FIG. 5 illustrates an exemplary backtracking process. In FIG. 5, a path 61*a* is already calculated for a terminal 60*a*, and a path for a terminal 60b may be calculated. Since the terminal 60b is surrounded by a wiring metal 62, a path 63a is blocked by the path 61a so that it may be difficult to calculate a path for the terminal 60b. The path calculation unit 15 recalculates the path for the terminal 60a and obtains a new path 61b different from the path 61a that is already calculated. The path calculation unit 15 may calculate a path 63b by carrying out the path calculation for the terminal 60b.

The path determination unit 16 determines whether or not the leading path is calculated for the macro terminal by the path calculation unit When the leading paths in all the placement patterns are calculated, the path determination unit 16 may determine that the leading wiring is available for all the macro terminals. When the leading path is not calculated in one of the placement patterns, the path determination unit 16 may determine that the leading wiring is not available for the terminals in the one of the placement patterns.

The storage unit 17 stores the paths calculated by the path calculation unit 15 in the memory unit 11 as the leading path information 11d. When the leading path is calculated for all the macro terminals in all the placement patterns, the memory unit 11 stores the leading paths of all the macro terminals for each placement pattern, as the leading path information 11d.

The wiring design unit 18 designs leading wiring for each macro terminal based on the leading path information 11d. For example, when the macros are placed in the integrated circuit and the inter-macro wiring is designed, the wiring design unit 18 reads from the leading path information 11d the leading path of the terminal corresponding to the placement pattern of the macros placed in the integrated circuit. The wiring design unit 18 designs the leading wiring for each macro terminal by placing wiring on the leading path read for each terminal. In FIG. 1, as an example, the placement pattern identification unit 12, the channel count calculation unit 13, the reduction ratio calculation unit 14, the path calculation unit 15, the path determination unit 16, the storage unit 17, and the wiring design unit 18 are provided separately. Alternatively, they may be integrated into one device, for example. The device may include an electronic circuit such as a central processing unit (CPU), a micro processing unit (MPU), etc. The device may include an integrated circuit such as an application specific integrated circuit (ASIC), a field programmable gate array (FPGA), etc.

Figure 6:
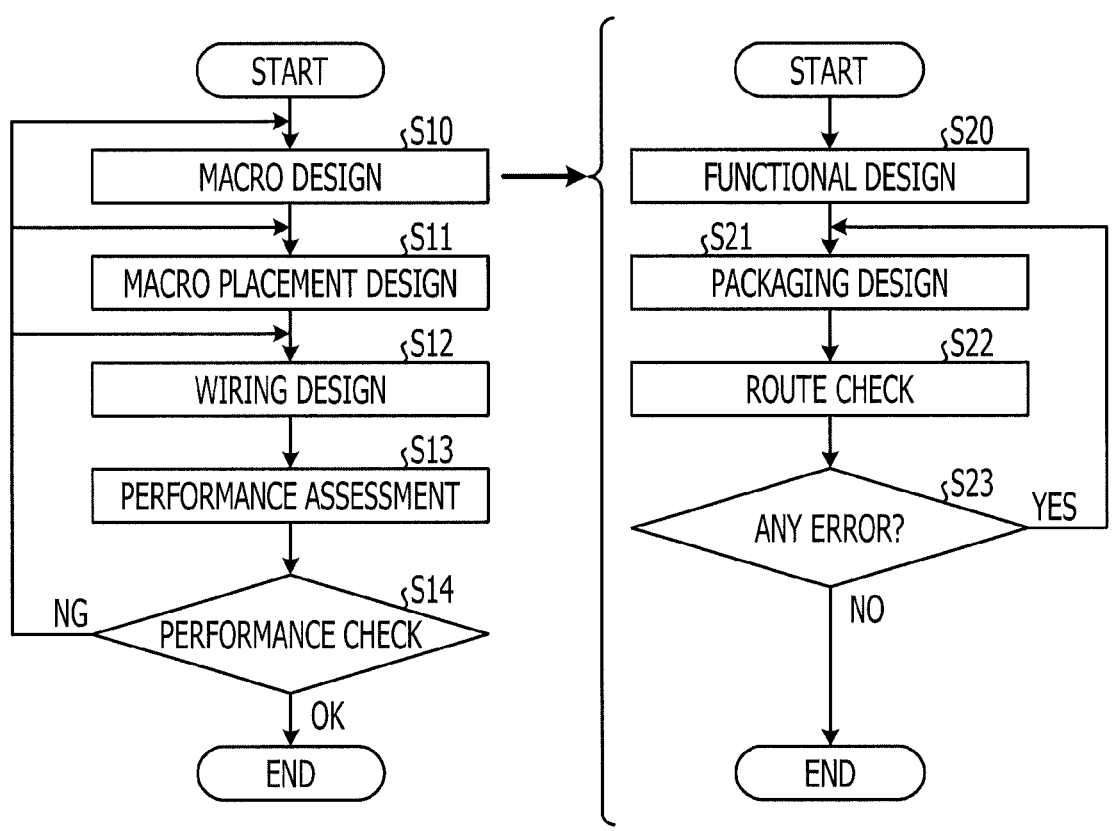
FIG. 6 illustrates an exemplary integrated circuit designing.

FIG. 6 illustrates an exemplary integrated circuit designing.

In the integrated circuit designing, in Operation S10, individual macros are designed. In Operation S11, a placement of the macros designed in the integrated circuit is designed. In Operation S12, wiring between the macros placed is designed. In Operation S13, the overall performance of the integrated circuit is assessed. When the result of the performance assessment is NG (NG in Operation S14), the process returns to, depending on the result, the individual macro design, the macro placement design, or the design of inter-macro wiring, for correction. When the result of the performance assessment is OK (OK in Operation S14), the process of integrated circuit design ends.

In the macro designing, in Operation S20, functional designing of each macro is carried out. In Operation S21, based on the functional design, packaging of each macro is designed. In Operation S22, it is determined whether or not leading wiring is available for all terminals of the macros, the packaging of which have been designed. When the leading wiring is not available for all the terminals (Yes in Operation S23), the process returns to the macro packaging design for correction. When the leading wiring is available for all the terminals (No in Operation S23), the process of the macro design ends. The layout design apparatus 10 illustrated in FIG. 1 may determine whether or not the leading wiring is available for all the terminals of the macros, packaging of which have been designed.

Figure 7:
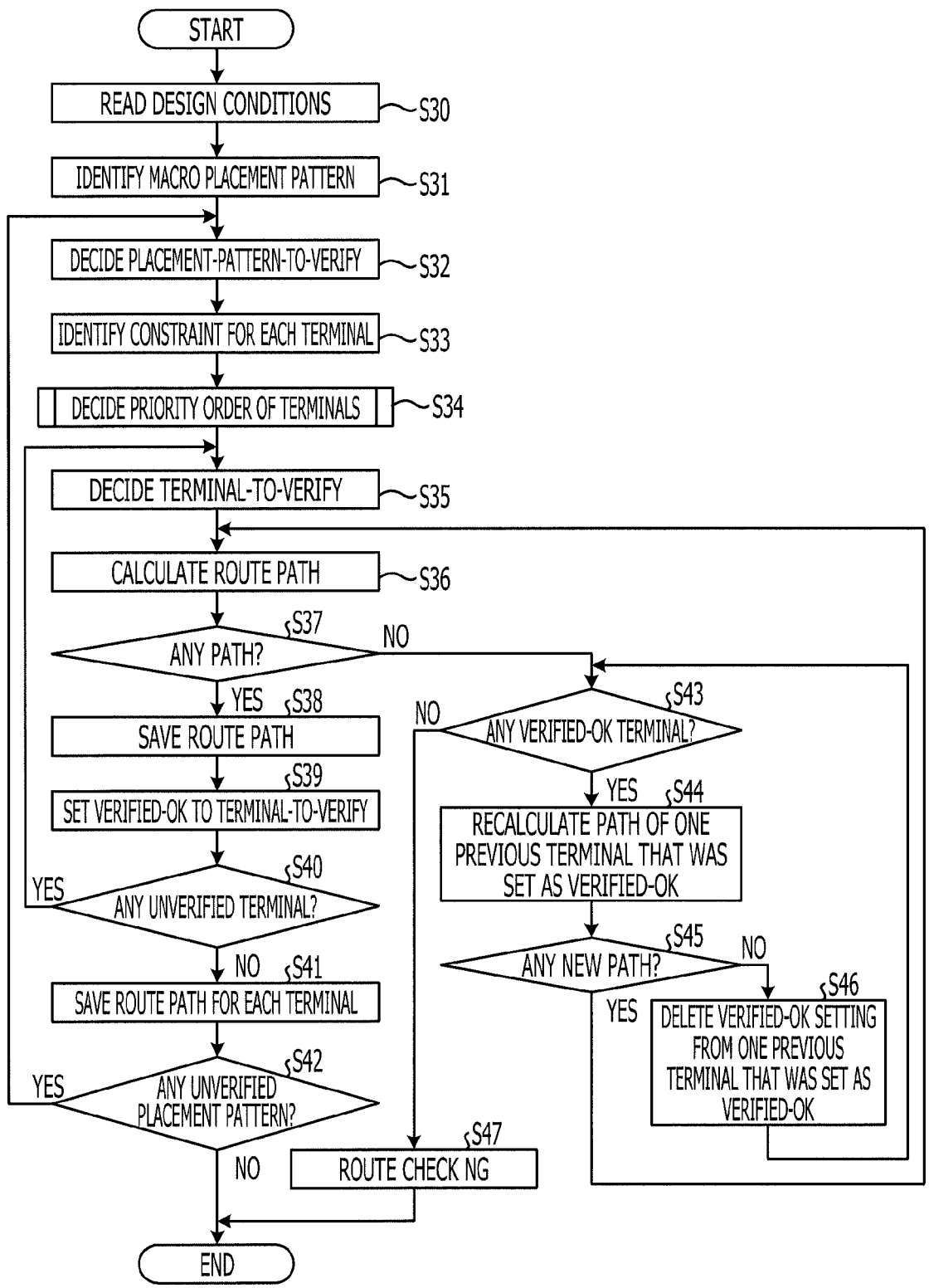
FIG. 7 illustrates an exemplary determining process.

FIG. 7 illustrates an exemplary determining process. In FIG. 7, it may be determined whether or not the leading wiring is available for all the macro terminals.

In Operation S30, the placement pattern identification unit 12 reads the design conditions from the design condition data 11b. In Operation S31, the placement pattern identification unit 12 places an imaginary placement grid and an imaginary wiring grid with intervals included in the design conditions, places macros based on the design data 11a while aligning them to the placement grid, and identifies the placement pattern of wiring channels 35. The placement pattern identified is stored in the memory unit 11 as the placement pattern information 11c. In Operation S32, of the placement patterns in the placement pattern information 11c, the channel count calculation unit 13 decides an unverified placement pattern as a placement-pattern-to-verify. In Operation S33, the channel count calculation unit 13 sets constraints such as the spacing region, etc. for each terminal in the placement-pattern-to-verify, based on the wiring width, the via size, or the minimum wiring spacing included in the design conditions. In Operation S34, the channel count calculation unit 13 decides the order of priority for the terminals in the placement-pattern-to-verify (priority order deciding process). In Operation S35, the path calculation unit 15 decides an unverified terminal as a terminal-to-verify based on the order of priority. In Operation S36, the path calculation unit 15 calculates a path for leading wiring from the terminal-to-verify to the leading target layer by using the wiring width, the via size, or the minimum wiring spacing defined in the design conditions. As to other terminals whose paths are already calculated, the path calculation unit 15 sets the newest path in order of calculation as the leading wiring. In Operation S37, the path determination unit 16 determines whether or not the path is calculated. When the path is calculated (Yes in Operation S37), in Operation S38, the storage unit 17 stores the path calculated in association with the terminal-to-verify in the memory unit 11 in order of the calculation. In Operation S39, the path determination unit 16 stores a setting of Verified-OK for the terminal-to-verify. In Operation S40, the path determination unit 16 determines whether or not there is any unverified terminal in the terminals in the placement-pattern-to-verify. When there is the unverified terminal (Yes in Operation S40), the process proceeds to Operation S35. When there is no unverified terminal (No in Operation S40), in Operation S41, of the paths stored in order of the calculation for each terminal, the storage unit 17 stores the newest path in order of the calculation for each terminal in the memory unit 11, as the leading information 11d. The memory unit 11 stores leading paths for each terminal wiring in the placement pattern to verify as the leading path information 11d. In Operation S42, the path determination unit 16 determines whether or not there is an unverified placement pattern in each placement pattern in the placement pattern information 11c. When there is an unverified placement pattern (Yes in Operation S42), the process proceeds to Operation S32. When there is no unverified placement pattern (No in Operation S42), the path determination unit 16 ends the process.

When no path is calculated (No in Operation S37), in Operation S43, the path calculation unit 15 determines whether or not there is a terminal that is set as Verified-OK in the placement-pattern-to-verify. When there is a terminal that is set as Verified-OK (Yes in Operation S43), in Operation S44, the path calculation unit 15 recalculates a new path, which is different from the ones calculated before and stored in the memory unit 11, for the one previous terminal that was set as Verified-OK in order of the priority. In Operation S45, the path calculation unit 15 determines whether or not the new path is calculated. When the new path is calculated (Yes in Operation S45), the path calculation unit 15 sequentially stores in the memory unit 11 the new path in association with the one previous terminal that was verified in order of calculation, and the process proceeds to Operation S36. When no new path is calculated (No in Operation S45), in Operation S46, the path calculation unit 15 deletes the Verified-OK setting of the one previous terminal that was set as Verified-OK in order of priority, and the process proceeds to Operation S43. The path recalculation is performed for still another one previous terminal that was set as Verified-OK in order of priority.

When there is no terminal that is set as Verified-OK (No in Operation S43), in Operation S47, the path determination unit 16 determines that the macro has a pattern in which no leading wiring is available, and the process ends. For example, when there is a terminal whose available leading wiring is not found by the path from the terminal being changed, leading wiring to all the macro terminals becomes very difficult to design, and thus the process ends. When it is determined that the macro has the pattern in which no leading wiring is available, the process returns to the macro packaging design and carries out macro redesigning.

Figure 8:
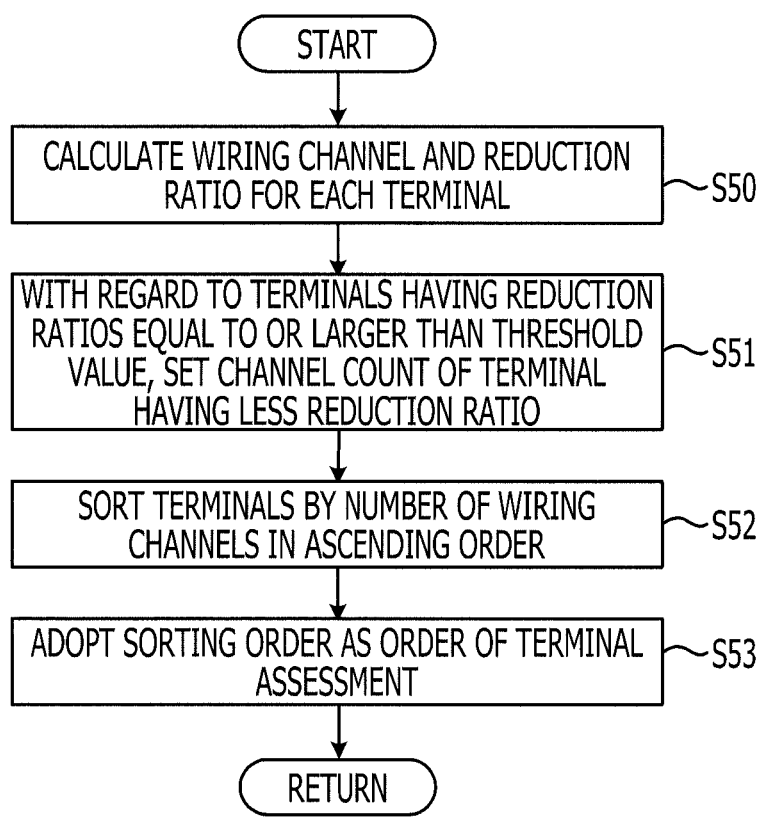
FIG. 8 illustrates an exemplary priority order deciding process.

FIG. 8 illustrates an exemplary priority order deciding process.

In Operation S50, the reduction ratio calculation unit 14 calculates, for each macro terminal of each placement pattern, the reduction ratio in the available channel count due to the effects from leading wiring of other terminals. In Operation S51, when the reduction ratio is equal to or larger than a certain threshold value, the reduction ratio calculation unit 14 identifies a combination of the terminals that reduce their respective channel counts, compares the counts of the available channels of the identified terminals, and resets the counts of the available channels of the identified terminals to the lowest value of the counts compared. In Operation S52, the reduction ratio calculation unit 14 sorts the terminals in ascending order of the number of the available channels. In Operation S53, the reduction ratio calculation unit 14 decides the sorted ascending order of the number of the available channels as the order of priority, and the process ends. Since the order of priority is set in ascending order of the number of the available channels and thus the verification starts from a terminal that has more severe constraint on its leading wiring region, the verification may find a problem in the macro designing in a shorter period of time. With regard to the combination of terminals that largely affect to each other, setting the number of the available channels to substantially the same may make positions in the order of calculation for calculating paths close to each other, whereby more effective backtracking process may be performed at the path recalculation.

The layout design apparatus 10 stores in the memory unit 11 the design data 11a of a hierarchical layout for a multilayer circuit including the macros therein. Based on the design data 11a stored in the memory unit 11, the layout design apparatus 10 calculates, for each terminal, the channel count of the channels used for leading wiring from the macro terminal to the predetermined wiring layer. The layout design apparatus 10 sequentially calculates, for each terminal, the path for leading wiring from the terminal to the predetermined wiring layer in ascending order of the channel count calculated, The layout design apparatus 10 determines whether or not the leading path is calculated for all the macro terminals. Since the path calculation for leading wiring starts from a terminal that has the less count of the available channels is performed, for example, the path calculation from a terminal that has the less freedom in leading wiring is performed, the leading paths may be calculated for all the terminals. Since it is determined that the leading path is calculated for all the macro terminals, it may be determined whether or not the leading wiring is available for all the macro terminals designed.

When it is determined that the leading path is calculated for all the macro terminals, the layout design apparatus 10 stores in the memory unit 11 the leading path information 11d regarding the leading paths calculated for all the macro terminals. The layout design apparatus 10 designs leading wiring for each macro terminal based on the leading path information 11d stored in the memory unit 11. In the designing inter-macro wiring, the leading wiring for each macro terminal may become easier.

The layout design apparatus 10 calculates, for each macro terminal, the reduction ratio of the channel count for the channels used for leading wiring to the predetermined wiring layer, due to the effects from leading wiring of other terminals. The layout design apparatus 10 sequentially calculates the path for a terminal which reduction ratio is larger than a certain threshold value and the path for a terminal that largely affects the reduction in the channel count. An effective path calculation may be carried out by such sequential calculations of the paths for the terminal which reduction ratio is larger than the certain threshold value and the terminal that largely affects the reduction in the channel count.

When there is a terminal whose path is not calculated, the layout design apparatus 10 sequentially goes back to the calculation of the terminal before the terminal whose path is not calculated, in ascending order of the channel count, until a new path different from any of the calculated paths is calculated. The layout design apparatus 10 repeats the path recalculation. When no path is calculated in any of the terminals, the exhaustive path calculation for the terminal whose path is not calculated may be performed by changing the path of the terminal which is already calculated.

The layout design apparatus 10 identifies the placement pattern of the wiring channels corresponding to the macro placement positions, and determines whether or not the leading path is calculated for all the macro terminals in all the placement patterns. Irrespective of the macro placement positions, the leading wiring from all the macro terminals may be confirmed.

The layout design apparatus 10 determines whether or not the leading path is calculated for all the macro terminals in the macro designing step. In the macro design step, the leading wiring from all the macro terminals is confirmed. Accordingly, back tracking in the design process may be reduced compared to a verifying process on availability of macro's leading path in the inter-macro wiring design.

For example, the paths may be calculated for all the macro terminals. For example, a terminal, which wiring channel count is equal to or larger than a threshold value, may be excluded from the path calculation since such a terminal has a high degree of freedom with regard to the leading wiring and the wiring may be easily led. The computational time for calculating the paths may be reduced. The threshold value for excluding from the path calculation may be, for example, a channel count equal to or larger than 50% of the wiring channels included in a macro. The threshold value may be adjusted externally.

The intervals of the wiring grid and the placement grid may be set to a constant value for the placement pattern identification. When the intervals of the wiring grid and the placement grid are varying, the placement pattern may be identified by a placement pattern identifying process.

Figure 9:
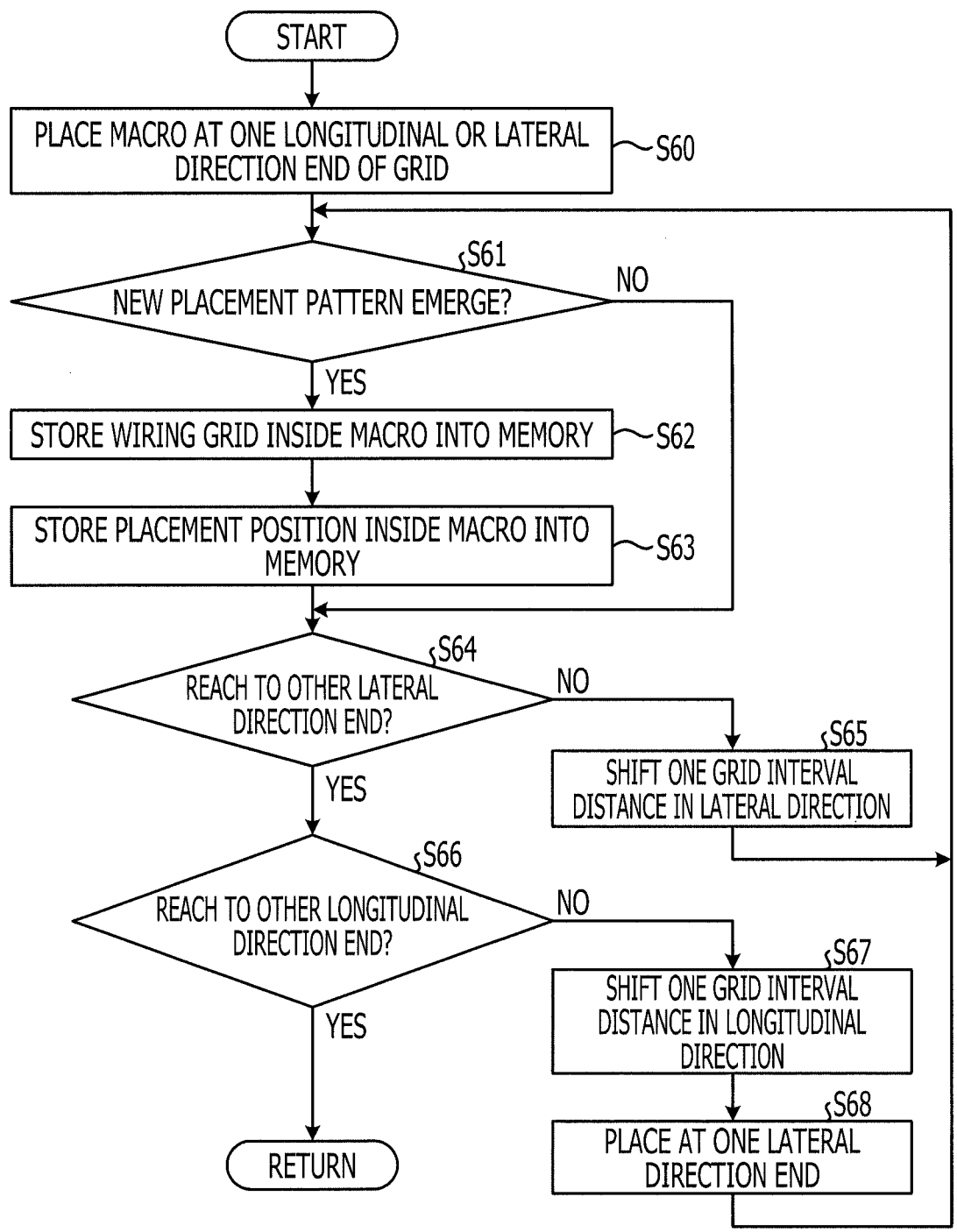
FIG. 9 illustrates an exemplary placement pattern identifying process.

FIG. 9 illustrates an exemplary placement pattern identifying process.

As illustrated in FIG. 9, in Operation S60, the placement pattern identification unit 12 places an imaginary placement grid and an imaginary wiring grid with intervals that are the design conditions, and places a macro at a longitudinal direction end or a lateral direction end of a region available for macro placement. In Operation S61, the placement pattern identification unit 12 determines whether or not a new placement pattern of the wiring grid emerges within a current macro placement position. When the new placement pattern emerges (Yes in Operation S61), in Operation S62, the placement pattern identification unit 12 stores the placement pattern of the wiring grid inside the macro. In Operation S63, the placement pattern identification unit 12 stores the macro placement position in the region available for macro placement. When no new placement pattern emerges (No in Operation S61), the process proceeds to Operation S64. In Operation S64, the placement pattern identification unit 12 determines whether or not the current macro placement position reaches the other lateral direction end of the region available for macro placement. When the macro does not reach the other lateral direction end (No in Operation S64), in Operation S65, the placement pattern identification unit 12 shifts the macro in the lateral direction by single placement grid interval distance. The process proceeds to Operation S61. When the macro reaches the other lateral direction end (Yes in Operation S64), in Operation S66, the placement pattern identification unit 12 determines whether or not the current macro placement position reaches the other longitudinal direction end of the region available for macro placement. When the macro does not reach the other longitudinal direction end (No in Operation S66), in Operation S67, the placement pattern identification unit 12 shifts the macro in the longitudinal direction by single placement grid interval distance. In Operation S68, the placement pattern identification unit 12 places the macro in one of the lateral direction ends, and the process proceeds to Operation S61. When the macro reaches the other longitudinal direction end (Yes in Operation S66), the process ends.

The placement pattern identification process may identify the placement pattern even when the intervals of the wiring grid and the placement grid are varying.

The processes illustrated in FIGS. 6-9 may be divided or merged, or part thereof may be omitted, depending on work load or usage.

The elements of each apparatus illustrated in the drawings may be functional elements or physical elements. For example, the whole or part of each apparatus may be distributed or integrated functionally or physically in an arbitrary unit, depending on work load or usage. For example, the placement pattern identification unit 12, the channel count calculation unit 13, the reduction ratio calculation unit 14, the path calculation unit 15, and the path determination unit 16 illustrated in FIG. 1 may be arbitrarily integrated.

Figure 10:
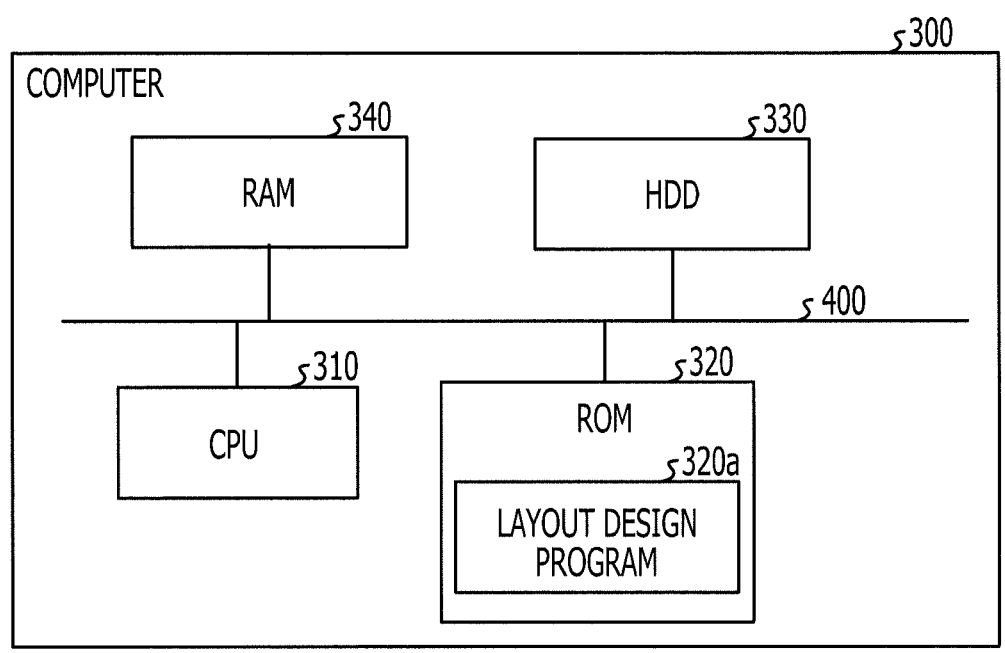
FIG. 10 illustrates an exemplary computer.

The processing of the layout design apparatus may correspond to program executions in a computer system such as a personal computer, a work station, etc. FIG. 10 illustrates an exemplary computer. The computer illustrated in FIG. 10 may execute a layout design program.

As illustrated in FIG. 10, a computer 300 includes a central processing unit (CPU) 310, a read only memory (ROM) 320, a hard disk drive (HDD) 330, and a random access memory (RAM) 340. The parts 300-340 are coupled via a bus 400.

For example, in the ROM 320, a layout design program 320a may be stored in advance. The layout design program 320a produces functions substantially the same as or similar to those of the placement pattern identification unit 12, the channel count calculation unit 13, the reduction ratio calculation unit 14, the path calculation unit 15, the path determination unit 16, the storage unit 17 and the wiring design unit 18 illustrated in FIG. 1. The layout design program 320a may be arbitrarily divided.

The CPU 310 reads and executes the layout design program 320a from the ROM 320.

The HDD 330 stores design data, design condition data, placement pattern information; and reading path information. The design data, the design condition data, the placement pattern information, and the reading path information may correspond to the design data 11a, the design condition data 11b, the placement pattern information 11c, and the reading path information 11d, respectively.

The CPU 310 reads the design data, the design condition data, the placement pattern information, and the leading path information, and stores them in the RAM 340. The CPU 310 uses the design data, the design condition data, the placement pattern information, and the leading path information stored in the RAM 320 to execute the layout design program 320a. Only desirable data may be stored in the RAM 340.

The layout design program 320a may not be stored in the HDD 330.

For example, the layout design program 320a may be stored in a portable physical medium to be inserted into the computer 300, such as a flexible disk (FD), a CD-ROM, a DVD disc, a magneto-optical disc, an IC card, etc. The computer 300 may read and execute the layout design program 320a from the portable physical medium.

The layout design program 320a may be stored in another computer, a server or the like coupled to the computer 300 via a public line, an Internet, a LAN, a WAN or the like. The computer 300 may read and execute the layout design program 320a from another computer or the server.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A layout design apparatus comprising:
   a memory unit to store design data of a hierarchical layout of a multilayer circuit including a macro;
   a channel count calculation unit to calculate a channel count of channels corresponding to a wiring grid and which are available for wiring to be led from a terminal of the macro to a wiring layer based on the design data stored in the memory unit; and
   a path calculation unit to calculate a path for wiring to be led from the terminal of the macro to the wiring layer in ascending order of the channel count.

2. The layout design apparatus according to claim 1, further comprising:
   a path determination unit to determine whether or not a path is calculated for all terminals of the macro by the path calculation unit.

3. The layout design apparatus according to claim 2, further comprising:
- a storage unit to store information regarding paths in the memory unit when it is determined by the path determination unit that the path is calculated for all terminals of the macro; and
- a wiring design unit to design leading wiring for each terminal of the macro based on the information stored in the storage unit.

4. The layout design apparatus according to claim 1, further comprising:
- a reduction ratio calculation unit to calculate, for each respective terminal of the macro, a reduction ratio of a channel count for channels available for wiring to be led from the respective terminal to the wiring layer, due to effects from leading wiring of other terminals,
- wherein the path calculation unit calculates the path based on a first terminal which reduction ratio is larger than a threshold value and a second terminal that affects the reduction in the channel count of the first terminal.

5. The layout design apparatus according to claim 1, wherein,
- when there is a terminal whose path is not calculated, the path calculation unit goes back to a path calculation of a previous terminal before the terminal whose path is not calculated.

6. The layout design apparatus according to claim 5, wherein the path calculation unit performs the path calculation until a new path other than a calculated path is obtained.

* * * * *